(12) United States Patent
Morelock

(10) Patent No.: US 6,657,866 B2
(45) Date of Patent: Dec. 2, 2003

(54) ELECTRONICS ASSEMBLY WITH IMPROVED HEATSINK CONFIGURATION

(76) Inventor: Robert C. Morelock, 2273 E. 151st St. #4, Carmel, IN (US) 46033

( * ) Notice: Subject to any disclaimer, the term of this patent is extended or adjusted under 35 U.S.C. 154(b) by 0 days.

(21) Appl. No.: 10/099,787

(22) Filed: Mar. 15, 2002

(65) Prior Publication Data

US 2003/0174469 A1 Sep. 18, 2003

(51) Int. Cl.[7] ................................................. H05K 7/20
(52) U.S. Cl. ........................ 361/719; 257/720; 174/252
(58) Field of Search ............................... 361/704, 705, 361/715, 722, 717–719, 773; 257/706, 707, 713, 718–720, 726, 727; 165/80.3, 185; 174/16.3, 252

(56) References Cited

U.S. PATENT DOCUMENTS

| | | | | |
|---|---|---|---|---|
| 4,647,126 A | * | 3/1987 | Sobota, Jr. .................... | 439/74 |
| 5,317,479 A | * | 5/1994 | Pai et al. ..................... | 361/773 |
| 5,379,187 A | * | 1/1995 | Lee et al. .................... | 361/707 |
| 5,596,231 A | * | 1/1997 | Combs ........................ | 257/796 |
| 5,650,914 A | * | 7/1997 | DiStefano et al. .......... | 361/704 |
| 5,787,576 A | * | 8/1998 | Warren et al. ................ | 29/832 |
| 5,856,911 A | * | 1/1999 | Riley .......................... | 361/704 |
| 5,920,458 A | * | 7/1999 | Azar .......................... | 361/704 |
| 6,000,125 A | * | 12/1999 | Kang .......................... | 29/832 |
| 6,376,907 B1 | * | 4/2002 | Takano et al. .............. | 257/704 |

* cited by examiner

Primary Examiner—Gerald Tolin

(57) ABSTRACT

An electronic assembly 10 is provided, including a substrate 12 having a first a second side 16, and at least one opening 18, and a power device 20 mounted on side 14, positioned over said at least one opening 18, and in thermal communication with said at least one power device 20 through the at least one opening 18.

10 Claims, 2 Drawing Sheets

ELECTRONICS ASSEMBLY WITH IMPROVED HEATSINK CONFIGURATION

TECHNICAL FIELD

The present invention relates generally to an electronics assembly with an improved heatsink configuration and more particularly to an electronics assembly with improved heatsinking of a power device attached to a substrate.

BACKGROUND OF THE INVENTION

Electronics assemblies are formed in a wide variety of configurations for a wide variety of applications. Often, however, they are comprised of a plurality of individual electronic components mounted on a circuit board or other substrate. The individual electronic components typically communicate electronically with each other through the substrate to form a useful electronic assembly. Although the individual electronic components themselves may come in a wide variety of embodiments, one particular type is commonly referred to as a power device. Power devices are electronic components that generate heat during operation. Commonly, the thermal energy generated by these power devices must be dissipated in order for the electronic assembly to function properly. Some power devices must be kept within a predetermined thermal range in order to reliably perform their function. Others, while able to withstand larger temperature ranges, may damage the substrate or neighboring electronic components if the thermal energy is not properly dissipated.

Numerous approaches have been developed in order to dissipate heat from these power devices. Various combinations of convection and radiation transfer have been utilized to transfer the thermal energy from the power devices. One well-known and successful approach has been through the use of a heatsink device. Heatsink elements provide a thermal well to absorb the heat generated by power devices. They often take the form of large blocks of metal, or other thermal conductive material, with the capability of absorbing the thermal energy from the power devices and dissipating it over a larger surface area. The specific configuration of such heatsink devices is virtually limitless, although common embodiments such as metal blocks, cases, and heat rail brackets are well known. Although the heatsink element may be modified into a variety of forms, thermal communication between the heat sink element and the power devices often requires careful design consideration.

One approach to providing communication between the heatsink element and the power devices has been to assemble the electronic assembly such that the heatsink contacts the top of the power device wherein the power device is positioned between the heatsink element and the circuit board or substrate. Although such a configuration appears to benefit from simplicity, specific embodiments can suffer from disadvantages. In order to insure proper contact between the heatsink element and the power device, for example, clamping forces may be developed pressing the power device down onto the substrate. It is possible for these clamping forces to cause electrical shorts when the power device is pressed into the substrate. This undesirable situation may result in improper function of the electronics assembly, reduced durability of the electronics assembly, or even complete failure of the electronics assembly. In addition, since the power devices are often not the only electronic components mounted to the substrate, the heatsink element must often be designed and positioned to only contact the power devices. Improper formation or positioning during assembly can result in damage to other electronic components or electrical shorts at other locations in the electronics assembly. The tight tolerances often required in manufacturing and assembly in order to avoid electrical shorts while continuing to provide adequate thermal contact may add undesirable cost increases to the electronics assembly.

A second traditional approach to providing thermal communication between the heatsink element and the power devices has been to position the heatsink on the opposing side of the substrate from the power device. In this configuration, excessive clamping forces on the power device and interference with other electronic components may be reduced. Despite these advantages, this configuration presents its own set of disadvantages. Thermal energy generated by the power devices must be transferred through the substrate in order to reach the heatsink element. The composition and formation of many substrates can make the dissipation of large quantities of thermal energy impractical and thereby create limitations on the types of power devices utilized in the electronic assembly. Furthermore, as adequate thermal contact between the heatsink element and the substrate is required, the substrate in turn may now experience undesirable clamping forces. Careful design and assembly procedures must be undertaken to insure the heat sink does not cause electrical shorts through contact with the substrate nor damage the substrate through the clamping forces. This, too, may lead to undesirable cost increases or undesirable failure or damage to the electronics assembly.

A third known technique of providing thermal communication between the heatsink element and the power devices is capable of reducing the clamping forces and associated electrical shorts as compared to the aforementioned configurations. This approach mounts the power devices directly on the heat sink element and then provides remote electrical communication between the power devices and the substrate through the use of procedures such as wire bonding. Although this configuration may provide some advantages in clamping force reduction, it can add undesirable increases to manufacturing and assembly costs. Often, the wire bonding, and similar procedures, require machinery and additional manufacturing steps that may increase the cost of the electronics assembly undesirably. Furthermore, the use of wire bonds may not be suitable for power devices with large current communication with the substrate. These high current power devices may require a more substantial electrical pathway to the substrate than can be practically provided by wire bonding or other remote attachment techniques.

It would, therefore, be highly desirable to have an electronics assembly with a thermal dissipation configuration with reduced clamping forces, reduced electrical shorts, and broad thermal dissipation capabilities. In addition, it would be highly desirable to have an electronics assembly with a thermal dissipation configuration that could be used with high current power devices.

SUMMARY OF THE INVENTION

It is, therefore, an object of the present invention to provide an electronic assembly with a thermal dissipation configuration that reduces clamping forces while providing broad thermal dissipation capabilities. It is a further object of the present invention to provide an electronics assembly with a thermal dissipation configuration that is capable of use with high current power devices.

In accordance with the objects of the present invention, an electronics assembly is provided including a substrate having a first side, a second side, and at least one opening. At least one power device is mounted on the first side of the substrate. A heatsink element is positioned on the second side of the substrate and is in thermal communication with the at least one power device through the at least one opening.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
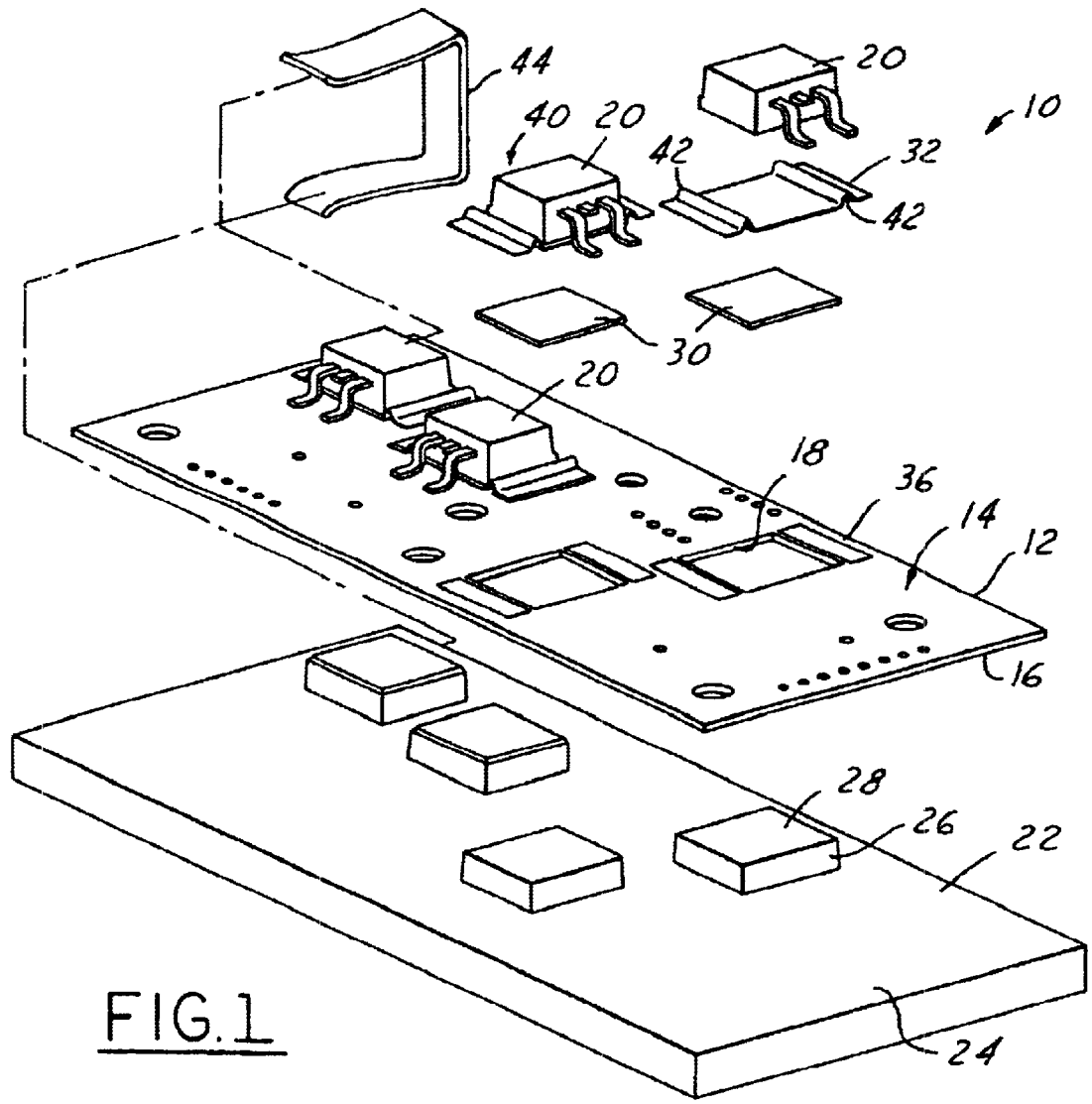
FIG. 1 is an illustration of an embodiment of an electronics assembly with a thermal dissipation configuration in accordance with the present invention, the electronics assembly illustrated in an exploded view.
Figure 2:
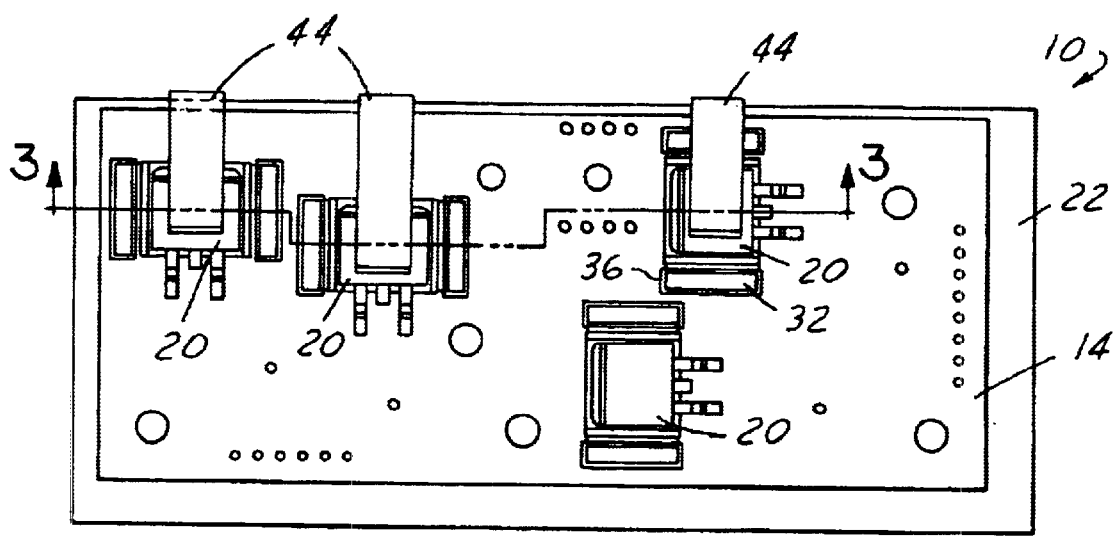
FIG. 2 is a top view of an embodiment of an electronics assembly with a thermal dissipation configuration in accordance with the present invention.
Figure 3:
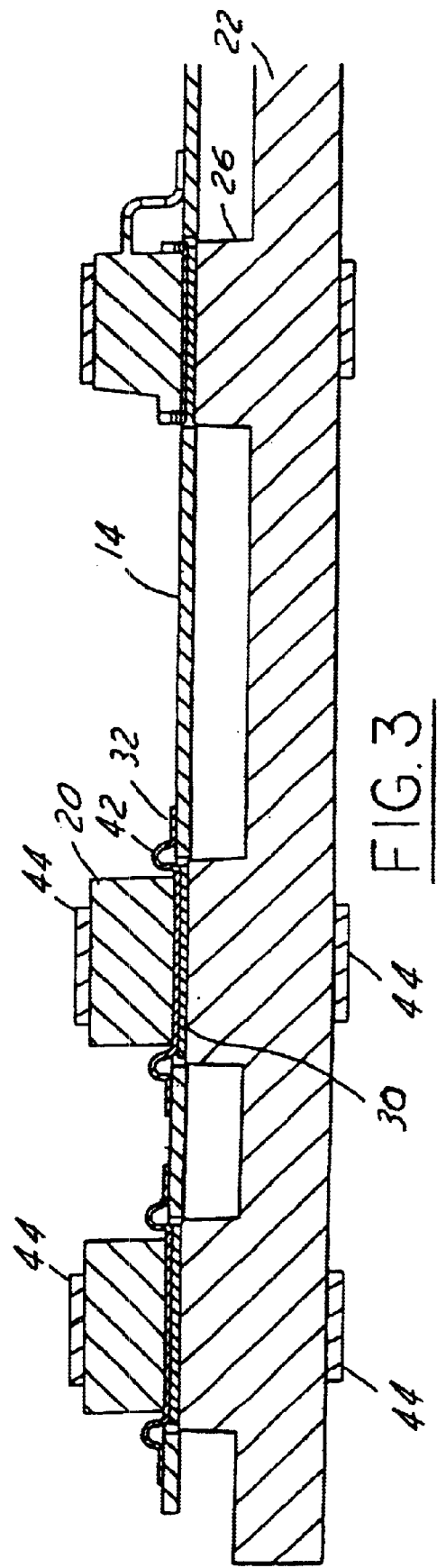
FIG. 3 is a cross-sectional illustration of the electronics assembly illustrated in FIG. 2, the cross-section taken along lines 3—3 in the direction of the arrows.

Referring now to FIG. 1 which is an illustration of an electronics assembly 10 in accordance with the present invention. The electronics assembly 10 includes a substrate 12. In one embodiment, the substrate 12 is intended to be a standard circuit board, although a variety of substrates are known in the prior art and contemplated by the present invention. The substrate 12 has a first side 14 and a second side 16. At least one opening 18 is formed in the substrate 12. The electronics assembly further includes a power device 20 mounted on the first side 14 of the substrate 12. The at least one power device 20 is mounted on the substrate 12 in a position directly over the at least one opening 18. In this fashion, a heatsink element 22 may be positioned on the second side 16 of the substrate 12 and yet can remain in thermal communication with the power device 20 through the at least one opening 18.

The present invention provides thermal transfer from the power device 20 to heatsink 22 while reducing clamping forces experienced by the power device 20 or the substrate 12. The at least one opening 18 in the substrate 12 allows the power device 20 to be placed in secured communication with the heatsink element 22 without the prior art detriments of either the power device 20 being pressed into the substrate 12 or the heatsink 22 being pressed into the substrate 12. In addition, thermal dissipation from the power device 20 into the heatsink 22 is not limited by having to physically pass through the material of the substrate 12. In this way, greater thermal dissipation may be accomplished without damage to the substrate 12 or neighboring components (not shown) mounted on the substrate 12.

Although the present invention has been described in a basic form, a variety of specific embodiments and additional features are contemplated. In one such embodiment, the heatsink element 22 includes a base portion 24 and at least one elevated portion 26. The at least one elevated portion 26 is placed in close communication with the at least one opening 18 to provide a thermal dissipation surface 28 for thermal communication with the power device 20. This allows the base portion 24 of the heat sink element 22 to remain separated from the second surface 16 of the substrate 12 to help prevent the heatsink element 22 from creating electrical shorts within the electronics assembly 10. Additionally, the present invention may further include an insulator element 30 positioned between the thermal communication surface 28 and the power device 20 to help prevent electrical shorting of the power device 20. Although a variety of thermally conductive insulator elements are known and contemplated by the present invention, in one embodiment the insulator element 30 is anodized aluminum.

In addition to the benefits provided by the at least one opening 18, the present invention may be further improved by including at least one conductive strap element 32 positioned in electrical communication with the power device 20. Although the conductive strap element 32 may be attached to the power device 20 in a variety of fashions, in one embodiment the conductive strap element 32 is mounted to the power device 20 using a high temperature solder. In this situation, the substrate 12 may further include at least one solder pad 36. Again, although the electrically conductive strap element 32 may be attached to the power device 20 in a variety of fashions, a high temperature connection is established using high temperature solder or high temperature electrical adhesive. The power device 20 and the electrically conductive strap element 32 may be preassembled into a power assembly 40 prior to attachment to the substrate 12. The high temperature connection allows the power assembly 40, and specifically the electrically conductive strap 32, to be attached to the solder pads 36 using conventional and low cost operation such as reflow soldering. In addition to providing a simple and cost effective method of attaching the power device 20 to the substrate 12, this configuration can also use the electrically conductive strap 32 to transfer high current signals from the power device 20 into the substrate 12. In this fashion, power devices 20 with high current output may be used with the electronics assembly 10.

Finally, in one embodiment, the electrically conductive strap element 32 may be formed with at least one stress absorbing element 42 such as the arc illustrated. The stress absorbing element 42 allows some vertical travel of the power device 20 such that the heatsink 22 may be pressed firmly into thermal communication with the electrically conductive strap element 32 without creating unnecessary stress on the power device 20 or the substrate 12. This provides further assurances of adequate thermal contact and communication while further reducing stresses on components within the electronic assembly 10. In addition, if a clamping element 44 is used to press the power device 20 into thermal communication with the heatsink 22, the stress reducing elements 42 can permit such movement without the clamping forces being translated into the substrate 12 or causing electrical shorts within the substrate. It should be understood that while one particular clamping element 44 has been illustrated, a wide variety of clamping elements are known and contemplated by the present invention.

While the invention is described in connection with one or more embodiments, it is to be understood that specific mechanisms and techniques which have been described are merely illustrative of the principles of the invention. Numerous modifications may be made to the methods and apparatus described without departing from the spirit and scope of the invention as defined and described by the appended claims.

What is claimed is:

1. An electronic assembly comprising:
   a substrate having a first side, a second side, and at least one opening;
   at least one power device mounted to and in electrical communication with an electrically conductive strap element, said electrically conductive strap element mounted to said first side of said substrate; and
   a heatsink element in thermal communication with said electrically conductive strap element and said at least one power device through said at least one opening, said electrically conductive strap element positioned between said heatsink element and said at least one power device, said electrically conductive strap element thermally engaged to and electrically isolated from said heatsink element.

2. An electronics assembly as described in claim 1 wherein said heatsink includes a base portion and an elevated portion, said elevated portion is positioned in close proximity to said at least one opening.

3. An electronic assembly as described in claim 1 further comprising at least one insulator element positioned between said electrically conductive strap element and said heatsink.

4. An electronic assembly as described in claim 3 wherein said insulator element comprises anodized aluminum.

5. An electronics assembly as described in claim 1 wherein said electrically conductive strap element provides high current electrical communication between said power device and said substrate.

6. An electronics assembly as described in claim 5 further comprising:
   at least one solder pad positioned on said substrate and in electrical communication with said electrically conductive strap element.

7. An electronic assembly as described in claim 1 wherein said electrically conductive strap element comprises copper.

8. An electronic assembly as described in claim 1 wherein said electrically conductive strap element includes at least one stress absorbing element.

9. An electronic assembly as described in claim 8 wherein said at least one stress absorbing element comprises an arc formed in said electrically conductive strap element.

10. An electronics assembly as described in claim 1 wherein said at least one power device is high temperature bonded to said electrically conductive strap element prior to mounting on said substrate.

* * * * *